(12) United States Patent
Kando (10) Patent No.: US 6,940,208 B2
(45) Date of Patent: Sep. 6, 2005

(54) SURFACE ACOUSTIC WAVE DEVICE

(75) Inventor: Hajime Kando, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 8 days.

(21) Appl. No.: 10/197,812

(22) Filed: Jul. 19, 2002

(65) Prior Publication Data

US 2003/0020366 A1 Jan. 30, 2003

(30) Foreign Application Priority Data

Jul. 24, 2001 (JP) ........................................ 2001-223415

(51) Int. Cl.[7] .............................................. H03H 9/25
(52) U.S. Cl. ............................... 310/313 R; 310/313 D
(58) Field of Search ....................... 310/313 R, 313 B, 310/313 D (56) References Cited

U.S. PATENT DOCUMENTS

| 3,886,504 | A | * | 5/1975 | Hartmann et al. | 333/195 |
| 3,952,268 | A | | 4/1976 | Schulz et al. | 333/155 |
| 5,061,870 | A | * | 10/1991 | Ieki et al. | 310/313 A |
| 5,888,646 | A | * | 3/1999 | Takahashi et al. | 428/336 |
| 6,072,263 | A | * | 6/2000 | Toda | 310/313 B |
| 6,291,923 | B1 | * | 9/2001 | Kadota | 310/313 A |
| 6,426,584 | B2 | * | 7/2002 | Yoshida et al. | 310/313 A |
| 6,429,569 | B1 | * | 8/2002 | Kadota | 310/313 R |
| 6,498,548 | B2 | * | 12/2002 | Kaneda et al. | 333/195 |
| 6,534,896 | B2 | * | 3/2003 | Jian et al. | 310/313 B |
| 6,577,210 | B1 | * | 6/2003 | Tsutsumi et al. | 333/195 |
| 6,603,371 | B2 | * | 8/2003 | Nakao et al. | 333/193 |
| 6,674,215 | B1 | * | 1/2004 | Yoshida et al. | 310/313 R |
| 6,677,696 | B1 | * | 1/2004 | Ruile | 310/313 A |
| 6,710,509 | B1 | * | 3/2004 | Kadota | 310/313 A |
| 6,713,940 | B2 | * | 3/2004 | Takamine | 310/313 R |
| 6,768,397 | B2 | * | 7/2004 | Takamine | 333/193 |
| 2002/0017969 | A1 | * | 2/2002 | Takamine | 333/193 |
| 2002/0063612 | A1 | * | 5/2002 | Takamine | 333/193 |

FOREIGN PATENT DOCUMENTS

| EP | 0 734 120 A1 | | 9/1996 | ............ H03H/9/02 |
| EP | 1 255 694 A1 | | 7/2002 | ............ H03H/9/25 |
| GB | 2 333 196 A | | 7/1999 | ............ H03H/9/02 |
| JP | 2-250414 | * | 10/1990 | ................. 333/193 |
| JP | 2-250415 | * | 10/1990 | ................. 333/193 |
| JP | 2-250416 | * | 10/1990 | ................. 333/193 |
| JP | 02-260908 | | 10/1990 | |
| JP | 02-305011 | | 12/1990 | |
| JP | 4-77012 | * | 3/1992 | ........... H03H/9/145 |
| JP | 06-268469 | | 9/1994 | |
| JP | 08-265088 | | 10/1996 | |
| WO | WO 01/28090 A1 | | 4/2001 | ............ H03H/9/25 |

OTHER PUBLICATIONS

Michio Kadota, "Research for Mass Production of Surface Acoustic Wave Filters for TV and VTR using Zinc Oxide Piezoelectric Films", pp. 83–90. Murata Manufacturing Co., Ltd.

(Continued)

Primary Examiner—Thomas M. Dougherty
(74) Attorney, Agent, or Firm—Keating & Bennett, LLP (57) ABSTRACT

A surface acoustic wave device includes a ZnO dielectric thin film on a quartz substrate and an IDT electrode having strips between the ZnO thin film and the quartz substrate. The IDT electrode has at least one region where the strips are disposed at an interval defined by approximately a half-wavelength of the surface acoustic wave. The duty ratio of the IDT electrode is preferably more than about 0.5. Alternatively, a protrusion is formed via a slope in the region of the ZnO thin film where the IDT electrode is disposed, and the inclination angle θ of the slope is more than about 30°.

10 Claims, 8 Drawing Sheets

OTHER PUBLICATIONS

Yahei Koyamada et al., "Analysis of SAW Resonators Using Long IDT's and Their Applications", '77/9 vol. J 60–A No. 9, pp. 805–812.

Hashimoto, "Introduction to Surface Acoustic Wave Device Simulation", Realize Corp., pp. 232–235.

Michio Kadota et al., "Reduction of Deviation of Frequency Characteristics of SAW Filters by Mechanical Polishing of ZnO Film Surface", A vol. J76–A No. 10, pp. 1339–1406, Oct. 1993.

Seiichi Mitobe et al., "Finite–Element Analysis of Periodically Perturbed Piezoelectric Waveguides", '85/1 vol. J68–C No. 1, pp. 21–27.

* cited by examiner

FIG. 9  ZnO THICKNESS = 0.3λ  H = 0.02λ

FIG. 10  ZnO THICKNESS = 0.3λ  H = 0.02λ

SURFACE ACOUSTIC WAVE DEVICE

BACKGROUND OF THE INVENTION

1. Field of the Invention

The present invention relates to surface acoustic wave devices for use as, for example, resonators and bandwidth filters, and more specifically, the present invention relates to a surface acoustic wave device including a dielectric thin film disposed on an elastic substrate and an IDT electrode or a reflector electrode disposed between the elastic substrate and the dielectric thin film.

2. Description of the Related Art

Surface acoustic wave devices generally used as bandwidth filters and other such filters for mobile communication equipment include at least one interdigital electrode (hereinafter referred to as an IDT electrode) including at least a pair of comb-like electrodes in contact with a piezoelectric component.

A piezoelectric substrate made of various piezoelectric materials is used for the piezoelectric component. Also, surface acoustic wave devices have been introduced in which a dielectric thin film having piezoelectric characteristics is disposed on an elastic substrate, such as a glass substrate or a piezoelectric substrate, and in which a dielectric thin film not having piezoelectric characteristics is disposed on a piezoelectric substrate. For example, a surface acoustic wave device having a dielectric thin film on an elastic substrate is disclosed in "Research for Mass Production of Surface Acoustic Wave Filters for TV and VTR using Zinc Oxide Piezoelectric Films" (Kadota, The 26th EM Symposium, 1997, pp. 83–90).

In general, surface acoustic wave devices having a known dielectric thin film have a transverse structure in which a plurality of IDT electrodes are disposed at predetermined intervals. The transverse structure allows strips of the IDT electrodes to reflect TTE (triple-transit echo), thus causing unwanted ripples. Accordingly, it is preferable to reduce the reflection at the strips of electrodes as much as possible to prevent the ripples. Therefore, double-strip type IDT electrodes, which do not cause acoustic reflection, and single-strip type IDT electrode in which reflection is reduced have been used.

On the other hand, various surface acoustic wave devices using unidirectional strips have recently been introduced to reduce the insertion loss thereof. These surface acoustic wave devices need to increase the reflection at the strips in order to increase the directionality thereof.

Also, surface acoustic wave devices having a resonator structure are disclosed in "Analysis of SAW Resonators Using Long IDT's and Their Applications" (IECE Transactions, 1977/9, Vol. J60-A, No. 9, pp. 805–812) and others. Reflectors used in these surface acoustic wave devices include strips capable of causing a large amount of reflection, so that they can give a desired amount of reflection even with a small number of strips. Also, the above-described "Analysis of SAW Resonators Using Long IDT's and Their Applications" teaches that increasing the amount of reflection at the strips of the multi-pair IDT disclosed therein leads to an IDT having a rapid conversion characteristic.

As described above, various surface acoustic wave devices which need to improve the reflection at the strips have been introduced. In these surface acoustic wave devices, the IDT electrode or the reflector electrode is disposed on the piezoelectric substrate.

On the other hand, in surface acoustic wave devices using the above-described dielectric thin film, more specifically, surface acoustic wave devices having a dielectric thin film having a piezoelectric property on a glass substrate or a piezoelectric substrate, and surface acoustic wave devices having a dielectric thin film of non-piezoelectric property on a piezoelectric substrate, the reflection coefficient of the strips of the IDT electrode or the reflector electrode is small. Therefore, it is difficult to improve the speed of the conversion by the IDT electrode and to reduce the size and the insertion loss of the surface acoustic wave device.

SUMMARY OF THE INVENTION

In order to overcome the problems described above, preferred embodiments of the present invention provide a surface acoustic wave device including a dielectric thin film on an elastic substrate, and an IDT electrode or a reflector electrode disposed between the dielectric thin film and the elastic substrate, having strips with a reflection coefficient that is increased, thus improving the speed of the conversion and reducing the size and the insertion loss thereof.

According to one preferred embodiment of the present invention, a surface acoustic wave device includes an elastic substrate and a dielectric thin film provided on the elastic substrate. At least one of the elastic substrate and the dielectric thin film is made of a piezoelectric material. At least one of an IDT electrode and a reflector electrode is disposed between the elastic substrate and the dielectric thin film. The IDT electrode and/or the reflector electrode includes at least one region where a strip is disposed with an interval defined by an approximately half-wavelength of the surface acoustic wave in the direction of propagation of the surface acoustic wave and the strip is used for reflection. The duty ratio of the strip is preferably greater than about 0.5.

By setting the duty ratio of the strip at greater than about 0.5, the reflection coefficient of the surface acoustic wave at the strip of the IDT electrode and/or the reflector electrode is greatly increased. Therefore, the IDT electrode having a duty ratio larger than about 0.5 has an increased resonance efficiency, and results in a resonator filter having sharp filter characteristics or a resonator having a high quality factor Q.

Also, the reflector electrode having a duty ratio larger than about 0.5 increases the reflection efficiency thereof. Thus, the number of strips of the reflector electrode can be reduced, and consequently, the surface acoustic wave device can be miniaturized.

According to another preferred embodiment of the present invention, a surface acoustic wave device includes an elastic substrate and a dielectric thin film provided on the elastic substrate. At least one of the elastic substrate and the dielectric thin film is made of a piezoelectric material. At least one of an IDT electrode and a reflector electrode is disposed between the elastic substrate and the dielectric thin film. The IDT electrode and/or the reflector electrode includes at least one region where a strip is disposed within an interval defined by an approximately half-wavelength of the surface acoustic wave in the direction of propagation of the surface acoustic wave, and the strip is used for reflection. The dielectric thin film covers the strip of the IDT electrode and/or the reflector electrode. The upper surface of the dielectric thin film covering the strip protrudes with respect to a portion of the dielectric thin film where the strip is not located, via a slope. The inclination angle of the slope with respect to the upper surface of the dielectric thin film overlying the strip is preferably greater than about 30°.

By setting the inclination angle at greater than about 30°, the reflection coefficient of the strips can be increased.

Preferably, the inclination angle is greater than about 40° to further increase the reflection coefficient. Therefore, when the inclination angle is greater than about 30°, the resonance efficiency is greatly increased and thus, a resonator filter having sharp filter characteristics or a resonator having a high quality factor Q can be achieved. Also, when the inclination angle is greater than about 30°, a miniaturized reflector can be achieved.

In preferred embodiments of the present invention, the dielectric thin film is disposed on an elastic substrate, and the IDT electrode and/or the reflector electrode is disposed between the elastic substrate and the dielectric thin film. The elastic substrate may be made of a material not having piezoelectric characteristics, such as glass or alumina. Alternatively, a piezoelectric substrate including a piezoelectric ceramic or a piezoelectric single crystal may be used. When the elastic substrate does not have piezoelectric characteristics, the dielectric thin film is preferably made of a piezoelectric material, such as ZnO. Also, when the elastic substrate has piezoelectric characteristics, the dielectric thin film may be piezoelectric or not.

In general, at least one IDT electrode is disposed in order to prepare a surface acoustic wave device. In preferred embodiments of the present invention, however, the IDT electrode and/or the reflector electrode includes at least one region where a strip is disposed within an interval, in the direction of propagation of the surface acoustic wave, defined by an approximately half-wavelength of the surface acoustic wave, and thus the strip is used for reflection.

Preferably, the thickness of the IDT electrode and/or the reflector electrode is greater than about $0.01\lambda$, wherein $\lambda$ represents the wavelength of the surface acoustic wave. Thus, the reflection coefficient of the strip is increased further.

Preferably, the density of the dielectric thin film is larger than that of the IDT electrode and/or the reflector electrode. Thus, the reflection coefficient of the strips can be effectively increased.

The IDT electrode and/or the reflector electrode may be made of aluminum or an aluminum alloy including copper, silicon, or titanium, and may be made of various metals or alloys, such as gold and copper. Also, the dielectric thin film may be made of ZnO, $Ta_2O_5$, CdS, or other suitable materials. The elastic substrate may be made of quartz, glass, sapphire, silicon, or other suitable materials.

In known IDT electrodes and reflector electrodes disposed on a piezoelectric substrate made of quartz, LT, LBO, or the like, the sign of $\kappa_{12}$ does not change even if the thickness or the line width of the electrodes is changed.

On the other hand, when the IDT electrode and the reflector electrode are made of aluminum and the dielectric thin film is made of ZnO, according to preferred embodiments of the present invention, the density of the dielectric thin film is larger than that of the IDT electrode and the reflector electrode. Therefore, by adjusting the line width or the thickness of the strips of the electrodes, the sign of $\kappa_{12}$ can be changed from positive to zero, and to negative. When the absolute value of $\kappa_{12}$ is maximized, the sign of $\kappa_{12}$ becomes negative.

In addition, when the sign of $\kappa_{12}$ is negative, the phases of reflected acoustic waves and reflected waves generated by electrical excitation are substantially equal to each other. Therefore, when an open-circuit reflector electrode, having strips that are electrically open, is used, a large reflection coefficient can be achieved based on the electromechanical coupling factor $K^2$.

Elastic substrates using glass or sapphire are well known. On the other hand, when a quartz substrate having a specific cutting orientation allowing the temperature coefficient of resonant frequency to be positive is used as the elastic substrate, the negative temperature coefficient of resonant frequency of the dielectric film is negated. Thus, a stable surface acoustic wave device having a temperature coefficient of resonant frequency that is zero can be achieved.

The structure of the IDT electrode and the reflector electrode is not limited, and the surface acoustic wave device may include a unidirectional IDT electrode. The unidirectional IDT electrode can have an increased reflection coefficient, according to preferred embodiments of the present invention.

Other features, elements, characteristics and advantages of the present invention will become more apparent from the following detailed description of preferred embodiments thereof with reference to the attached drawings.

DETAILED DESCRIPTION OF PREFERRED EMBODIMENTS

The present invention will be further illustrated with preferred embodiments below with reference to the drawings.

Figure 1A:
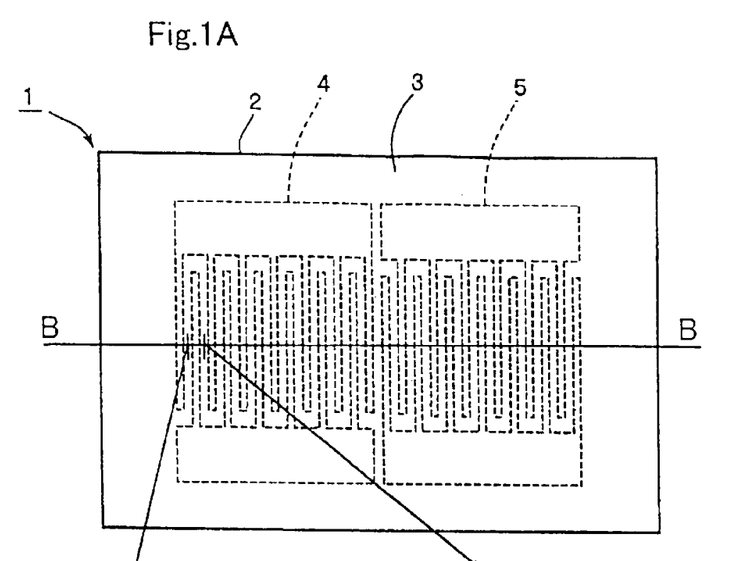
FIG. 1A is a schematic sectional view of a surface acoustic wave device according to a first preferred embodiment of the present invention.
Figure 1B:
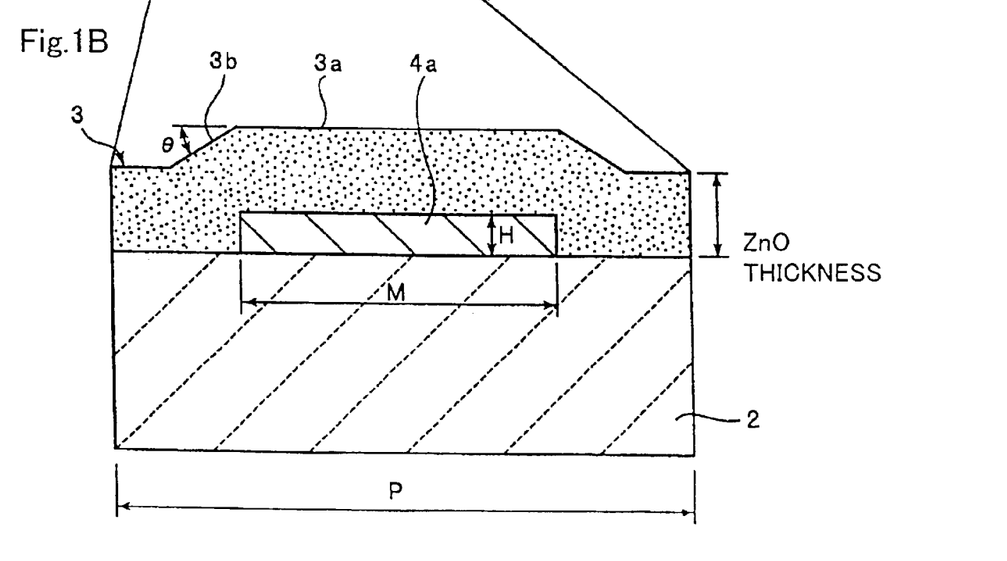
FIG. 1B is a schematic fragmentary sectional view taken along line B—B in FIG. 1A.

FIG. 1A is a schematic sectional view of a surface acoustic wave device according to a first preferred embodiment of the present invention and FIG. 1B is a schematic fragmentary sectional view taken along line B—B in FIG. 1A.

The surface acoustic wave device 1 of this preferred embodiment includes a ZnO thin film 3, acting as a dielectric thin film, disposed on a 27°-rotated Y-cut quartz substrate 2, for example. IDT electrodes 4 and 5 preferably made of an aluminum thin film are disposed between the quartz substrate 2 and the ZnO thin film 3.

In the surface acoustic wave device 1, the vibration of the IDT electrodes 4 and 5 generates Rayleigh waves having a surface acoustic wave velocity of about 2500 m/s to about 3000 m/s propagating in the X direction.

The ZnO thin film 3 is preferably formed on the quartz substrate 2 by a film deposition method, such as sputtering. In this instance, a region of the ZnO thin film 3 covers strips 4a of the IDT electrode 4 disposed on the quartz substrate 2. As shown in FIG. 1B, the upper surface of the ZnO thin film 3 protrudes in the region thereof covering the strips 4a. Hence, a protrusion 3a is formed from the other region of the ZnO thin film 3 with a slope 3b therebetween.

The inclination angle θ of the slope 3b with respect to the upper surface of the protrusion 3a is normally about 30° (for example, "Reduction of Deviation of Frequency Characteristics of SAW Filters by Mechanical Polishing of ZnO film Surface", IECE Transactions, 1993/10, Vol. J76-A, No. 10, pp. 1399–1406).

The inventors determined the stop-band frequencies of open-circuit strips and short-circuit strips and the surface acoustic wave velocity in a free surface by the finite element method introduced in "Finite-Element Analysis of Periodically Perturbed Piezoelectric Waveguides" (IECE Transactions, 1985/1, Vol. J68-C, No. 1, pp. 21–27). The strip 4a shown in FIG. 1B is disposed within an interval defined by approximately a half-wavelength. Also, the inventors determined $\kappa_{12}/k_0$ representing the amount of reflection of Rayleigh waves at the strips, in accordance with a method introduced in "Introduction to Surface Acoustic Wave Device Simulation" (Hashimoto, Realize Corp., p. 233). $\kappa_{12}$ represents a mode coupling coefficient according to the mode coupling theory, and $k_0$ represents $\lambda/2\pi$.

The results are shown in FIGS. 2A to 4.

FIGS. 2A, 2B, 3A, and 3B show the relationships between $\kappa_{12}/k_0$, the duty ratio, and the thickness H of the strips when the thickness T of the ZnO thin film 3 was about 0.2λ to about 0.5λ, the thickness H of the strips 4a was about 0.01λ to about 0.04λ, and the inclination angle θ of the slope 3b was about 30°. The duty ratio is provided by M/P, in which P represents a pitch of the strip (pitch corresponds to about λ/2, the interval defined by the half-wavelength) and M represents a width of the strip as shown in FIG. 1B.

Figure 4:
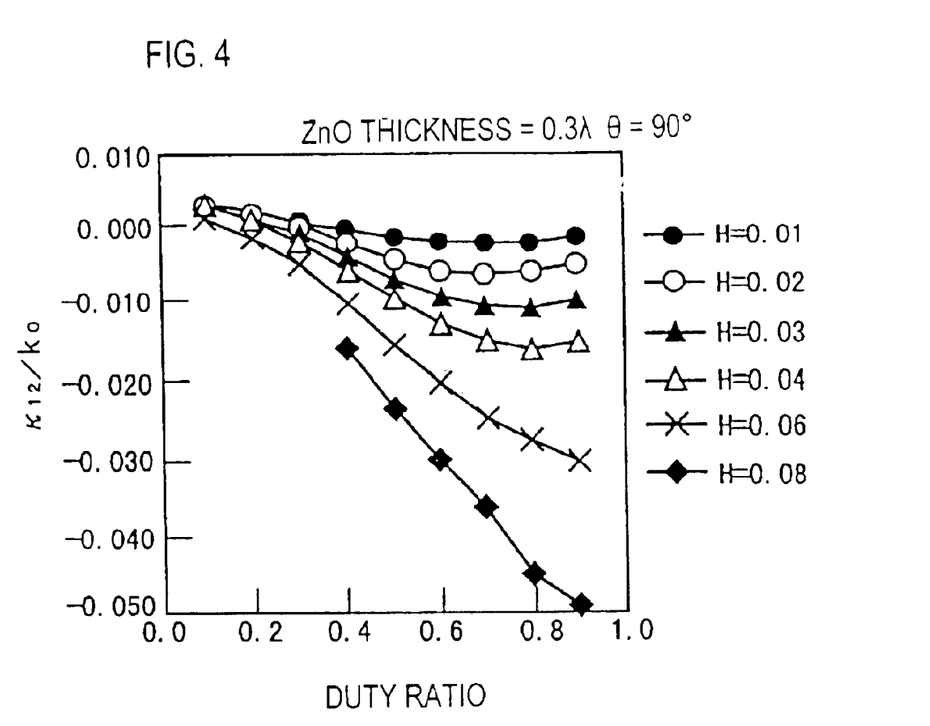
FIG. 4 is a graph showing the relationship between $\kappa_{12}/k_0$, the duty ratio, and the thickness H of the strips when the thickness T of the ZnO thin film is $0.3\lambda$, the thickness H of the strips is about $0.01\lambda$ to about $0.08\lambda$, and the inclination angle $\theta$ is 90°, in the first preferred embodiment of the present invention.

FIG. 4 shows the relationship between $\kappa_{12}/k_0$, the duty ratio, and the thickness H of the strips 4a when the ZnO thin film thickness T was about 0.3λ, the thickness H of the strips 4a was about 0.01λ to about 0.08λ, and the inclination angle θ was about 90°.

FIGS. 2A to 4 exhibit that when the duty ratio is small, the absolute value of $\kappa_{12}$ is small, and that when the thickness H of the strips is small, $\kappa_{12}$ is positive. Also, as the duty ratio increases, $\kappa_{12}$ becomes negative. It is considered that the density of the Al strips 4a (=2.69 g/cm$^3$) being lower than that of the ZnO thin film 3 (=5.68 g/cm$^3$) causes this phenomenon.

Therefore, a duty ratio larger than about 0.5 results in a larger absolute value of $\kappa_{12}$ in comparison with when the duty ratio is about 0.5 though the absolute value shows a slight change depending on the inclination angle θ. Thus, the amount of reflection can be increased. Preferably, the duty ratio is preferably about 0.6 or more so that the absolute value of $\kappa_{12}$ is maximized.

Figure 5:
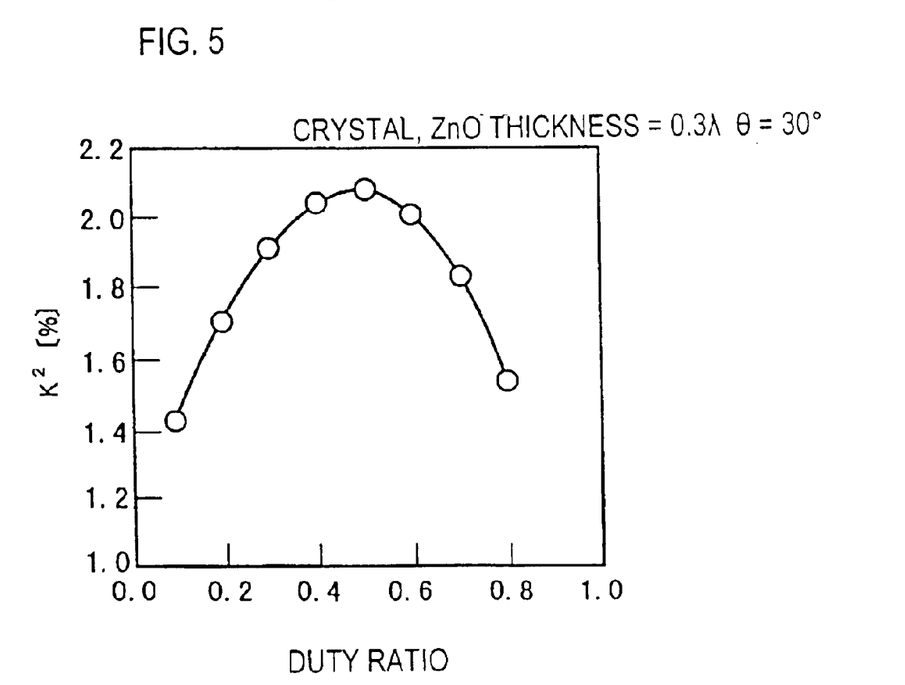
FIG. 5 is a graph of a comparative example showing the relationship between the electromechanical coupling factor $K^2$ and the duty ratio when the thickness T of the ZnO thin film is about $0.3\lambda$, the thickness H of the strips is about $0.02\lambda$, and the inclination angle $\theta$ is about 30°.

FIG. 5 shows, as a comparative example, the relationship between the electromechanical coupling factor K$^2$ and the duty ratio when the ZnO thin film thickness T was about 0.3λ, the thickness H of the strip 4a was about 0.02λ, and the inclination angle θ was about 30°. As shown in FIG. 5, the electromechanical coupling factor K$^2$ exhibits a maximum value when the duty ratio is about 0.5 and it decreases as the duty ratio deviates from about 0.5. Accordingly, when, for example, a resonator or a resonator filter is prepared in the present invention, the duty ratio can be selected depending on the bandwidth desired, which has a close correspondence with the electromechanical coupling factor.

Figure 6:
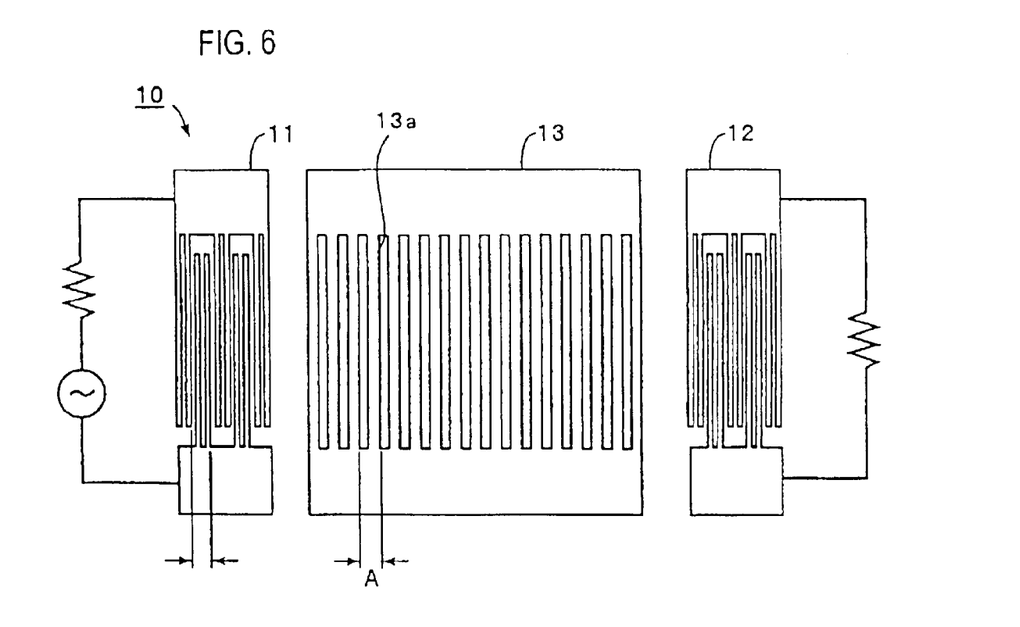
FIG. 6 is a schematic plan view of electrodes of a surface acoustic wave device according to a second preferred embodiment of the present invention.
Figure 7A:
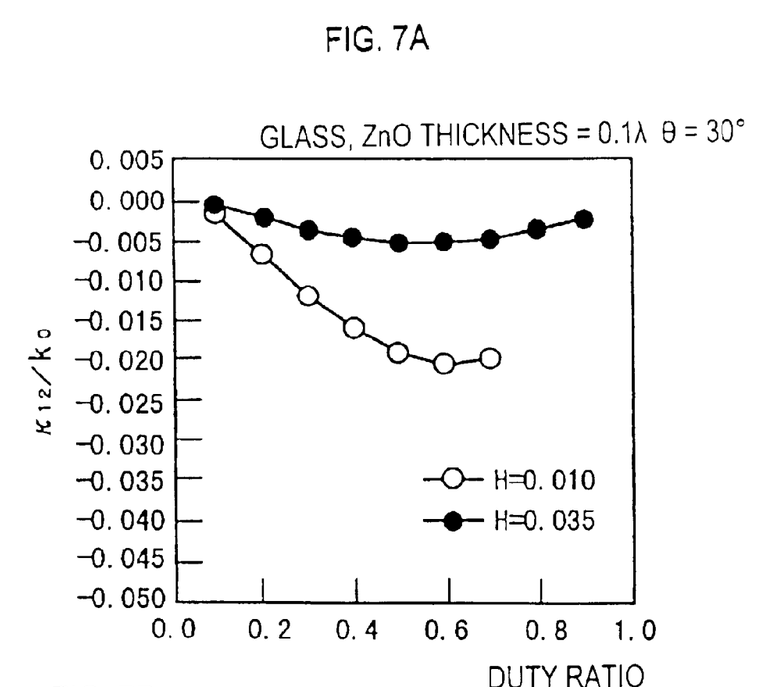
FIGS. 7A and 7B are graphs showing the relationship between $\kappa_{12}/k_0$, which represents reflection efficiency, the duty ratio, and the thickness H of strips, in the third preferred embodiment of the present invention.
Figure 7B:
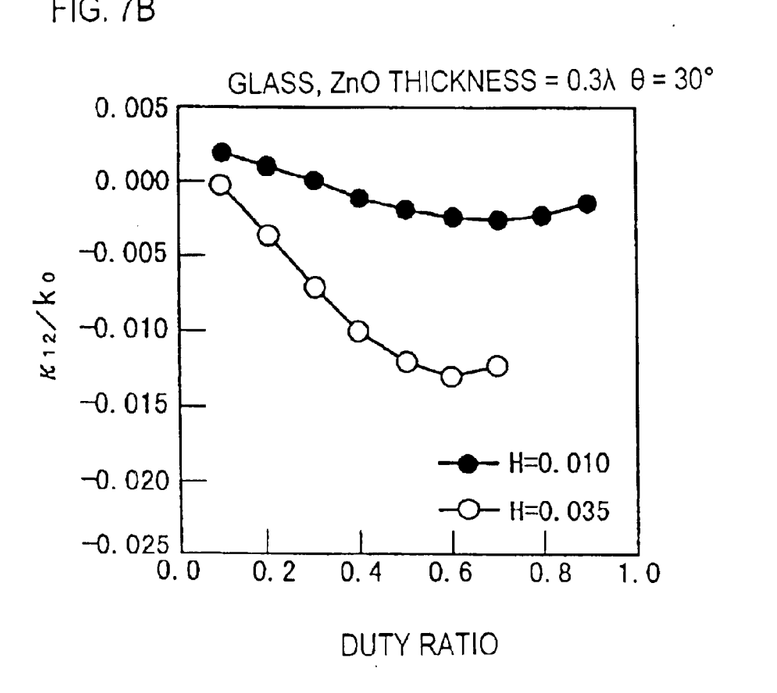
Figure 8A:
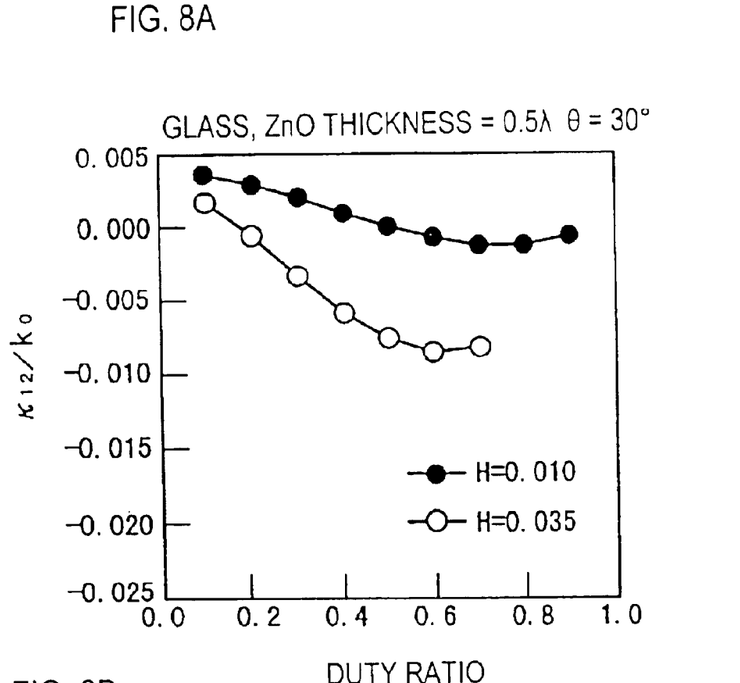
FIGS. 8A and 8B are graphs showing the relationship between $\kappa_{12}/k_0$, which represents reflection efficiency, the duty ratio, and the thickness H of strips, in the third preferred embodiment of the present invention.
Figure 8B:
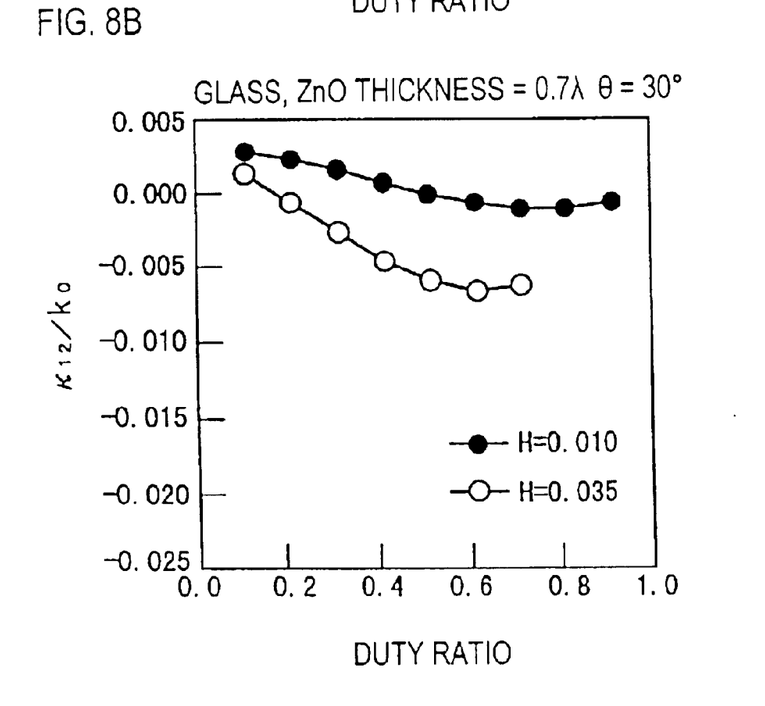

FIG. 6 is a schematic plan view of electrodes of a surface acoustic wave device according to a second preferred embodiment of the present invention.

This surface acoustic wave device 10 includes IDT electrodes 11 and 12 and a reflector electrode 13 disposed between the IDT electrodes 11 and 12. The reflector electrode 13 has 300 regions A, in the direction of propagation of the surface acoustic wave. In the regions, each strip 13a is disposed within an interval defined by a half-wavelength. The IDT electrodes 11 and 12 are preferably double-strip type electrodes having 20 pairs of strips. The strips of the IDT electrodes 11 and 12 and the reflector electrode 13 are disposed at substantially the same pitch.

A 27°-rotated Y-cut quartz substrate is preferably used as the elastic substrate. The IDT electrodes 11 and 12 and the reflector electrode 13 are disposed on this quartz substrate, and then a ZnO thin film, which is not shown in the drawing, is formed. Specifically, the electrodes shown in FIG. 6 are disposed between the quartz substrate and the ZnO thin film, as in the first preferred embodiment. Also, the IDT electrodes 11 and 12 and the reflector electrode 13 are preferably made of aluminum.

The surface acoustic wave device 10 shown in FIG. 6 exhibits frequency transmission characteristics in which the surface acoustic wave propagated from the IDT electrode 11 to the IDT electrode 12 is not propagated in the reflection bandwidth of the reflector electrode 13 but propagated outside of the bandwidth. In the frequency transmission characteristics of the surface acoustic wave device 10, therefore, a stop band occurs in the vicinity of the center frequency thereof. On the basis of bandwidth of the stop band, $\kappa_{12/k0}$ was measured in accordance with the following equation (1).

$$\kappa_{12}/k_0 = (\text{bandwidth of stop band/center frequency})/2 \quad (1)$$

Table 1 shows $\kappa_{12}/k_0$ determined according to the above.

TABLE 1

| ZnO thin film thickness T | Electrode thickness H | Duty ratio | $\kappa_{12}/k_0$ |
|---|---|---|---|
| 0.30 λ | 0.021 λ | 0.50 | 0.0051 |
| 0.30 λ | 0.021 λ | 0.75 | 0.0060 |

Figure 2A:
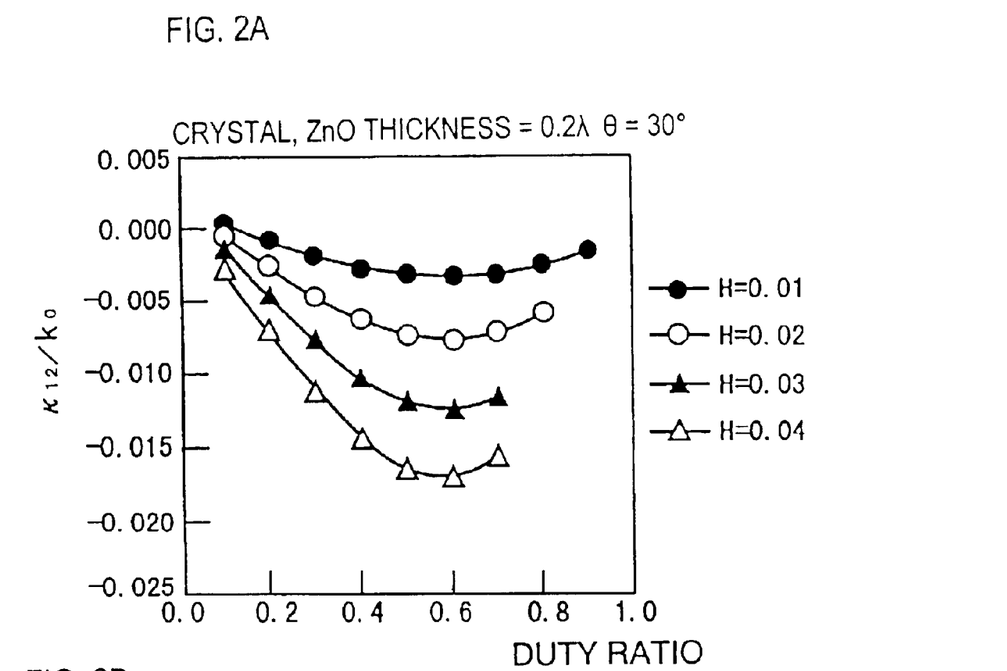
FIGS. 2A and 2B are graphs showing the relationship between $\kappa_{12}/k_0$, which represents reflection efficiency, the duty ratio, and the thickness H of strips, in the first preferred embodiment of the present invention.
Figure 2B:
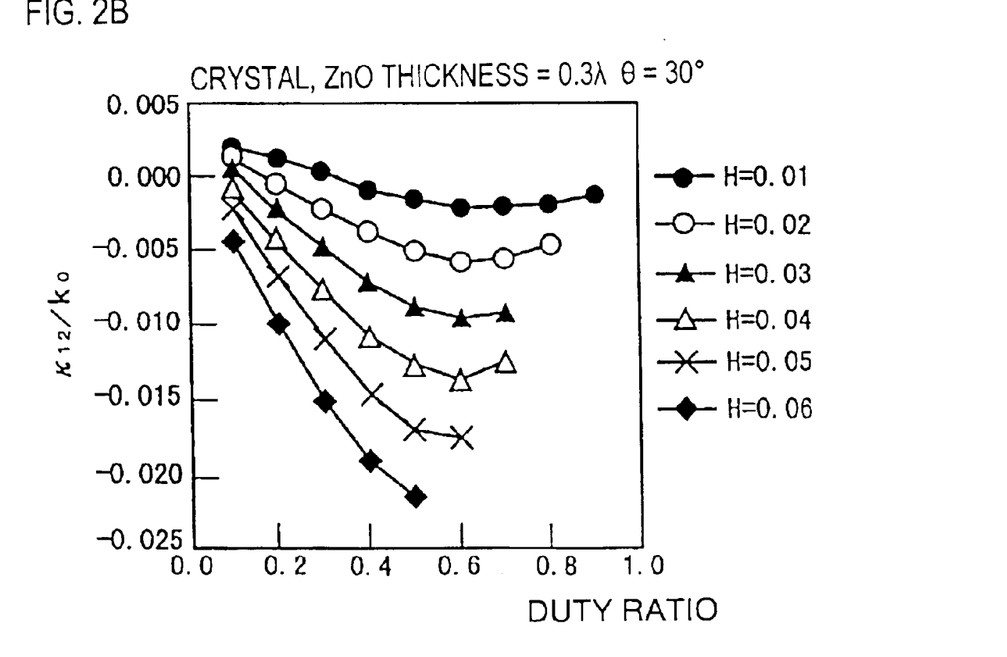
Figure 3A:
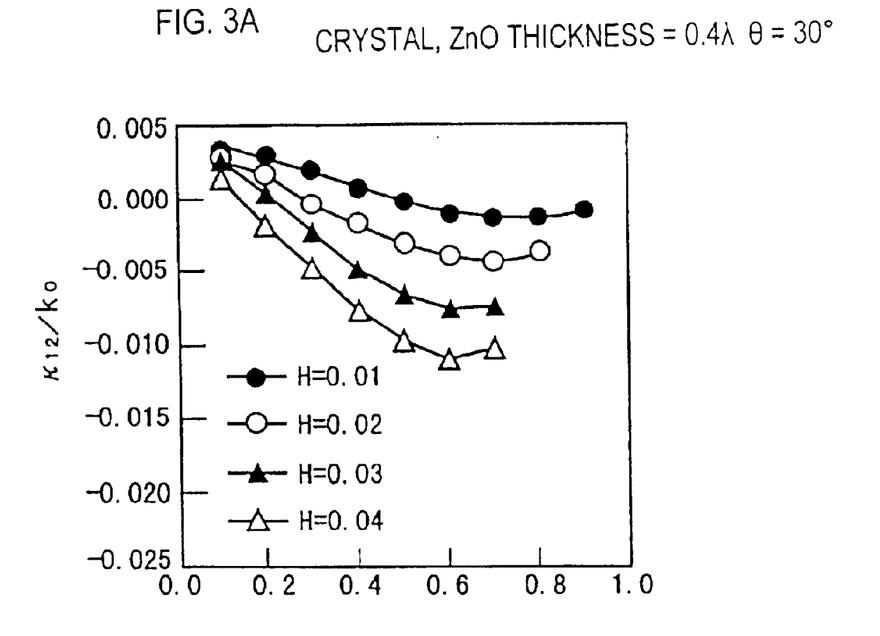
FIGS. 3A and 3B are graphs showing the relationship between $\kappa_{12}/k_0$, which represents reflection efficiency, the duty ratio, and the thickness H of strips, in the first preferred embodiment of the present invention.
Figure 3B:
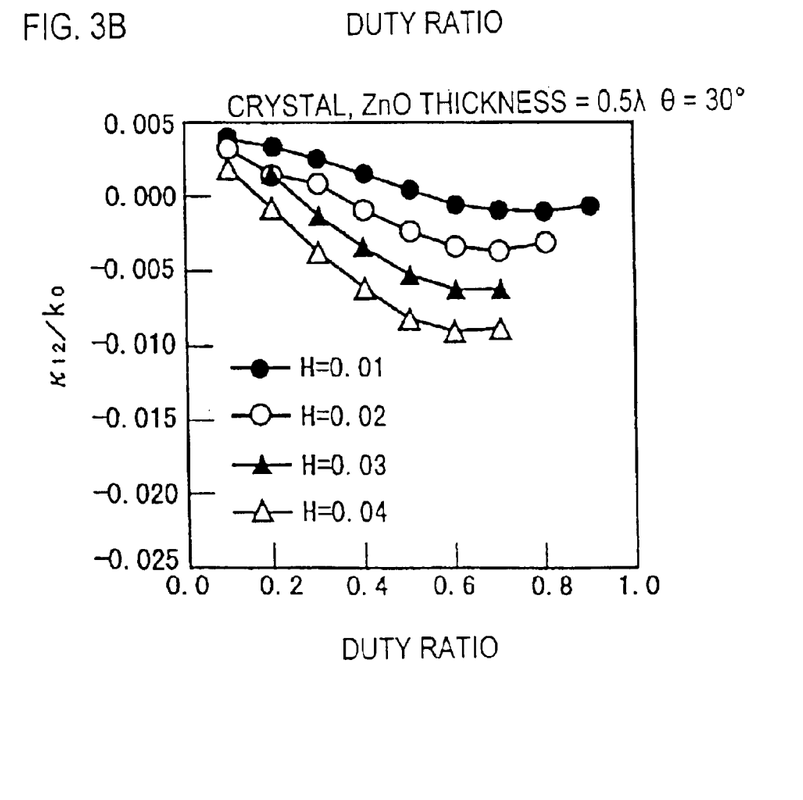

Table 1 shows that the values shown in FIG. 2B and the actual measured values are substantially the same.

A surface acoustic wave device of a third preferred embodiment is prepared as in the first preferred embodiment except that a glass substrate is used instead of the quartz substrate. In this instance, Rayleigh waves occur at a surface acoustic wave velocity of about 2500 m/s to about 2900 m/s.

FIGS. 7A to 8B show the relationships between $\kappa_{12}/k_0$, duty ratios, and thickness H of the strips when the thickness T of the ZnO thin film was about 0.01λ, to about 0.7λ, the thickness H of the strips was about 0.01λ to about 0.35λ, and the inclination angle θ of the slope was about 30°.

As shown in FIGS. 7A to 8B, when the thickness of the ZnO thin film 3 is about 0.2λ or more and the thickness H of the strips is about 0.01λ, reflection hardly occurs at a duty ratio of about 0.5, and $\kappa_{12}$ increases as the duty ratio deviates from duty ratio of about 0.5. Also, when the thickness H of the strips is more than about 0.01λ, for example, 0.35λ, and the duty ratio is more than about 0.5, the absolute value of $\kappa_{12}$ becomes larger in comparison with when the duty ratio is about 0.5, and thus the reflection coefficient is increased. When the duty ratio is about 0.6 or more, the absolute value of $\kappa_{12}$ is maximized, and thus the reflection coefficient is increased further.

A surface acoustic wave device as shown in FIG. 1 is prepared. However, the thickness T of the ZnO thin film 3 is about 0.3λ, the thickness H of the strips 4a is about 0.02λ. The relationship between $\kappa_{12}/k_0$ and the duty ratio was investigated while the inclination angle θ was changed in the range of about 20° to about 80°. The results are shown in FIG. 9.

Figure 9:
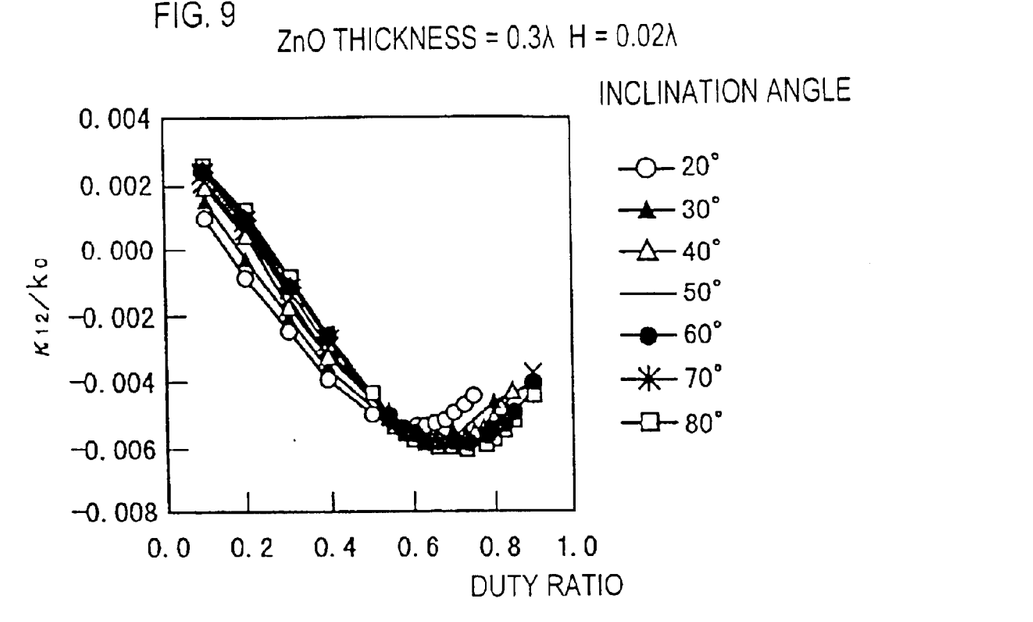
FIG. 9 is a graph showing the relationship between $\kappa_{12}/k_0$ and the duty ratio when the thickness T of the ZnO thin film is about $0.3\lambda$, the thickness H of the strips is about $0.02\lambda$, and the inclination angle $\theta$ is about 20° to about 80°, in a fourth preferred embodiment of the present invention.

FIG. 9 shows that, the absolute value of $\kappa_{12}$ at an optimal value of the duty ratio changes depending on the inclination angle θ, and that when the inclination angle θ becomes larger than about 30°, which is a normal angle, the absolute value of $\kappa_{12}$ also increases.

Figure 10:
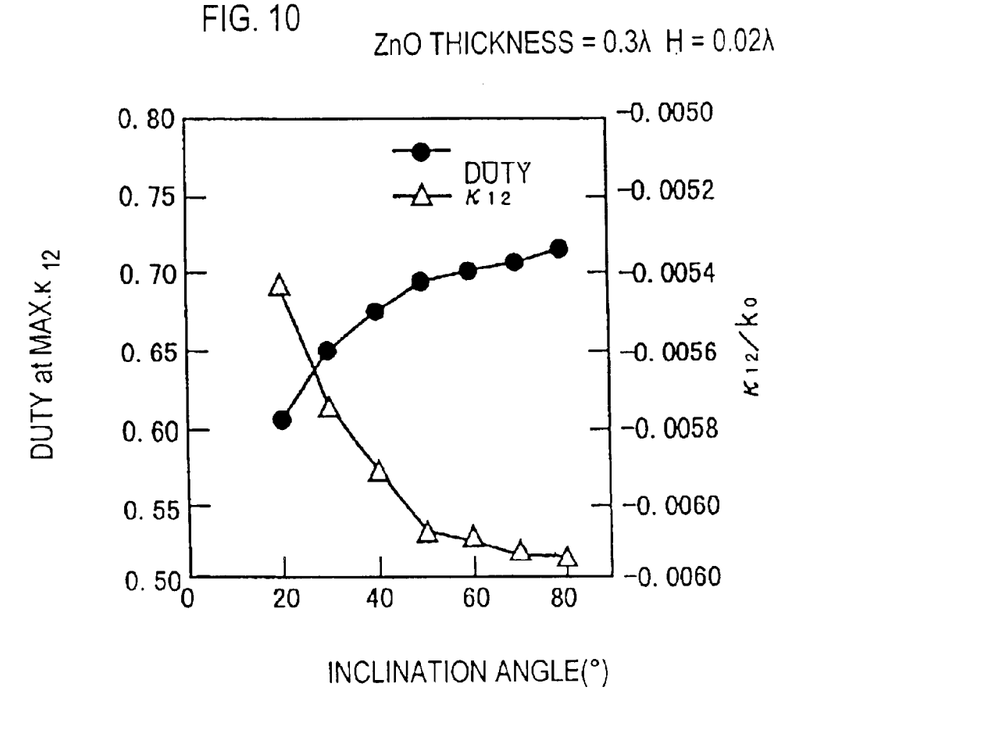
FIG. 10 is a graph showing the duty ratios allowing the absolute value of $\kappa_{12}$ to be maximized and the inclination angle dependence of $\kappa_{12}/k_0$ at those duty ratios, in the fourth preferred embodiment of the present invention.

FIG. 10 shows the duty ratios, at several inclination angles θ, allowing the absolute value of $\kappa_{12}$ to be maximized and $\kappa_{12}/k_0$ at those duty ratios. FIG. 10 exhibits that when the inclination angle θ is greater than about 30°, the absolute value of $\kappa_{12}$ becomes larger, and that, preferably, setting the inclination angle θ at about 40° or greater, $\kappa_{12}$ can be stabilized against changes in the inclination angle θ, and thus, a surface acoustic wave device having a large absolute value of $\kappa_{12}$ can be achieved.

When the ZnO thin film is preferably formed by sputtering, the inclination angle θ can be readily controlled by adjusting the incident angle of the particles for forming the film. For example, by adjusting the angle between the planetary and the substrate, as in "Practical Applications of SAW Filters Using ZnO Thin Film for TV" (Kadota, The 26th EM Symposium, 1997, p. 84, FIG. 3), to bring the incident angle of the particles close to the vertical direction, the inclination angle θ can be readily larger than about 30°.

Also, by forming the sides in the cross-sections of the strips of the electrodes so as to be substantially perpendicular to the surface of the elastic substrate, that is, by making the sides in the cross-sections steep, the inclination angle θ can be large. Steep sides in the cross-sections of the strips of the electrodes can be readily achieved by selecting the method for preparing the IDT electrode and the reflector electrode. For example, dry etching is most suitable to make the shape of the cross-sections steep, lift-off is second most suitable, and wet etching is third most suitable.

In the first to fourth preferred embodiments, the dielectric thin film is preferably made of ZnO. Besides ZnO, the dielectric thin film may be made of various dielectric materials, such as $SiO_2$, AlN, $Ta_2O_5$, and CdS. In other words, even when a dielectric thin film is formed such that the above-described inclination angle θ of the protrusion in the surface thereof affects the amount of reflection of the surface acoustic wave, the same effects as in the various preferred embodiments can be achieved.

Also, in the various preferred embodiments, the surface acoustic wave device preferably includes the aluminum IDT or reflection electrode. However, even when the surface acoustic wave device includes a usual metal such as copper or gold, the same effects as in the various preferred embodiments can be achieved.

In the first and second preferred embodiments, a 27°-rotated Y-cut quartz substrate is used, but quartz substrates having other crystal orientations may be used. The glass substrate used in the third preferred embodiment may be formed of various glasses such as borosilicate glass and Pyrex (registered trademark) glass. The elastic substrate of the present invention is not limited to quartz and glass substrates, but it may be formed with a piezoelectric substrate including a piezoelectric single crystal or a piezoelectric ceramic.

The surface acoustic wave device of various preferred embodiments of the present invention has at least one region in which the strips are disposed at an interval defined by approximately a half-wavelength, as describe above. When the reflector electrode has this structure, in which a plurality of such regions defined by approximately a half-wavelength are continuously disposed, the number of strips can be reduced in comparison with known reflector electrodes. Also, IDT electrodes having a plurality of the regions continuously disposed increases the resonance efficiency in the IDT electrodes, thus achieving an excellent resonator filter and a resonator having a high quality factor Q.

The duty ratio of the IDT electrode and/or the reflector electrode including at least one region where a strip is disposed with an interval defined by an approximately half-wavelength of the surface acoustic wave in the direction of propagation of the surface acoustic wave is greater than about 0.5. Accordingly the reflection efficiency of the surface acoustic wave at the IDT electrode and/or the reflector electrode is greatly increased.

Also, when the above-described half-wavelength regions are used for a reflection element of a unidirectional IDT electrode, such as FEUDT or EWC electrode, the unidirectional characteristics of the electrode can be further improved.

According to various preferred embodiments of the present invention, the surface acoustic wave device including a dielectric thin film on an elastic substrate and at least one of an IDT electrode and a reflector electrode disposed between the dielectric thin film and the elastic substrate, having strips used for refection can increase the reflection efficiency of the strips. Thus, the surface acoustic wave device can be miniaturized and the insertion loss thereof can be greatly reduced.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:
    an elastic substrate;
    a dielectric thin film provided on the elastic substrate, at least one of said elastic substrate and said dielectric thin film being made of a piezoelectric material; and
    at least one of an IDT electrode and a reflector electrode disposed between the elastic substrate and the dielectric thin film, said at least one of said IDT electrode and said reflector electrode including at least one region where a strip is disposed within an interval defined by approximately a half-wavelength of the surface acoustic wave in the direction of propagation of the surface acoustic wave, and said strip being used for reflection of surface acoustic waves; wherein the duty ratio of the strip is greater than about 0.6;

the thickness of said at least one of said IDT electrode and said reflector electrode is greater than about 0.01λ, wherein λ represents the wavelength of the surface acoustic wave ;and the dielectric thin film covers the strip of said at least one of said IDT electrode and said reflector electrode, the upper surface of the dielectric thin film covering the strip has a slope and protrudes with respect to a portion of the dielectric thin film where the strip is not disposed, and an inclination angle of the slope with respect to the upper surface of the dielectric thin film covering the strip is greater than about 30°.

2. A surface acoustic wave device comprising:

an elastic substrate;

a dielectric thin film provided on the elastic substrate, at least one of said elastic substrate and said dielectric thin film being made of a piezoelectric material; and at least one of an IDT electrode and a reflector electrode disposed between the elastic substrate and the dielectric thin film, said at least one of said IDT electrode and said reflector electrode including at least one region where a strip is disposed within an interval defined by approximately a half-wavelength of the surface acoustic wave in the direction of propagation of the surface acoustic wave, and said strip being used for reflection of surface acoustic waves; wherein the duty ratio of the strip is greater than about 0.6;

the density of the dielectric thin film is larger than the density of said at least one of said IDT electrode and said reflector electrode; and the dielectric thin film covers the strip of said at least one of said IDT electrode and said reflector electrode, the upper surface of the dielectric thin film covering the strip has a slope and protrudes with respect to a portion of the dielectric thin film where the strip is not disposed, and an inclination angle of the slope with respect to the upper surface of the dielectric thin film covering the strip is greater than about 30°.

3. A surface acoustic wave device according to claim 1, wherein said at least one of said IDT electrode and said reflector electrode comprises aluminum.

4. A surface acoustic wave device according to claim 1, wherein said dielectric thin film comprises ZnO thin film.

5. A surface acoustic wave device according to claim 1, wherein the elastic substrate comprises one of quartz and glass.

6. A surface acoustic wave device according to claim 1, wherein said at least one of said IDT electrode and said reflector electrode comprises a unidirectional IDT electrode.

7. A surface acoustic wave device according to claim 2, wherein said at least one of said IDT electrode and said reflector electrode comprises aluminum.

8. A surface acoustic wave device according to claim 2, wherein said dielectric thin film comprises ZnO thin film.

9. A surface acoustic wave device according to claim 2, wherein the elastic substrate comprises one of quartz and glass.

10. A surface acoustic wave device according to claim 2, wherein said at least one of said IDT electrode and said reflector electrode comprises a unidirectional IDT electrode.

* * * * *